United States Patent
Tsunekawa et al.

(10) Patent No.: US 8,139,325 B2
(45) Date of Patent: Mar. 20, 2012

(54) TUNNEL MAGNETORESISTIVE THIN FILM

(75) Inventors: Koji Tsunekawa, Kawasaki (JP); Yoshinori Nagamine, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 365 days.

(21) Appl. No.: 12/376,551

(22) PCT Filed: Jun. 6, 2008

(86) PCT No.: PCT/JP2008/060419
§ 371 (c)(1),
(2), (4) Date: Apr. 17, 2009

(87) PCT Pub. No.: WO2008/155996
PCT Pub. Date: Dec. 24, 2008

(65) Prior Publication Data
US 2010/0033878 A1    Feb. 11, 2010

(30) Foreign Application Priority Data
Jun. 19, 2007  (JP) .................. 2007-161326

(51) Int. Cl.
*G11B 5/33*    (2006.01)
(52) U.S. Cl. .................... 360/324.2
(58) Field of Classification Search ............... 360/324.2
See application file for complete search history.

(56) References Cited

U.S. PATENT DOCUMENTS

| 6,326,637 B1 * | 12/2001 | Parkin et al. ............... 257/9 |
| 2001/0013999 A1 | 8/2001 | Koi et al. .................. 360/324.11 |
| 2002/0064595 A1 | 5/2002 | Nomura et al. ............... 427/131 |
| 2003/0072111 A1 | 4/2003 | Hasegawa et al. ........ 360/324.12 |
| 2006/0256484 A1 | 11/2006 | Sato et al. ................... 360/324.2 |

FOREIGN PATENT DOCUMENTS

| JP | 2001-189503 | 7/2001 |
| JP | 2002-167661 | 6/2002 |
| JP | 2003-188440 | 7/2003 |
| JP | 2006-319259 | 11/2006 |
| WO | WO 2008/155995 A1 | 12/2008 |

OTHER PUBLICATIONS

Worledge et al., *Magnetoresistance Measurement of Unpatterned Magnetic Tunnel Junction Wafers by Current-In-Plane Tunneling*, Applied Physics Letter, vol. 83, No. 1, pp. 84-86 (Jul. 7, 2003).
Tsunekawa et al., *Giant Tunneling Magnetoresistance Effect in Low-resistance CoFeB/MgO(001)/CoFeB Magnetic Tunnel Junctions for Read-head Applications*, Applied Physics Letter, 87, pp. 072503-1 to 072503-3 (2005).
Araki Satoru, 2.2 Method of Manufacturing of TMR • GMR Device (Magnetic Film •Tunnel Film), MRAM Technology ~From Basics to LSI Applications~, SIPEC Corporation, pp. 78 and 79 (Feb. 28, 2002).
International Search Report Issued in Counterpart International Application PCT/JP2008/060419.

* cited by examiner

*Primary Examiner* — David D Davis
(74) *Attorney, Agent, or Firm* — Fitzpatrick, Cella, Harper & Scinto (57) ABSTRACT

A tunnel magnetoresistive thin film has a high MR ratio and improves heat resistance while maintaining a thin film of a Ru layer used as a non-magnetic layer so that the Ru layer expresses a preferable exchange coupling magnetic field even through annealing is performed at a high temperature. In the tunnel magnetoresistive thin film, at least one of a first pinned magnetic layer and a second pinned magnetic layer that are layered having the non-magnetic layer for exchange coupling therebetween has a layered structure of two or more layers made of magnetic materials different from each other.

4 Claims, 7 Drawing Sheets

TUNNEL MAGNETORESISTIVE THIN FILM

TECHNICAL FIELD

The present invention relates to a tunnel magnetoresistive thin film (preferably a spin valve magnetoresistive thin film) used in a magnetic reproducing head of a magnetic disk driving device and a storage element and a magnetic sensor of a magnetic random access memory, and a magnetic multi-layer formation apparatus.

BACKGROUND

A spin valve tunnel magnetoresistive thin film having an amorphous CoFeB as a ferromagnetic electrode and an MgO film having a NaCl structure as a tunnel barrier layer is disclosed in Nonpatent Literature 1. A CoFe layer is used as a first pinned magnetic layer and an amorphous CoFeB layer is used as a second pinned magnetic layer in such tunnel magnetoresistive thin film. Then, CoFe having a body-centered cubic structure is crystallized from amorphous CoFeB through annealing at high temperature, and an epitaxial relationship of CoFe (001) [110]//MgO (001) [100] is realized with a (001)-oriented MgO layer. Accordingly, a high TMR (Tunneling Magneto Resistance) effect as in theory can be obtained (refer to Nonpatent Literature 2).

However, the film thickness of a Ru layer that is generally used as a non-magnetic layer for exchange coupling is set to be thin so as to generate a high exchange coupling magnetic field between the first pinned magnetic layer and the second pinned magnetic layer. Specifically, the thickness is 0.7 to 0.9 nm, at which a $2^{nd}$ peak of a RKKY (Ruderman Kittel Kasuya Yoshida) interaction is said to occur, as disclosed in Nonpatent Literature 3. Because of that, the thin Ru layer diffuses into the first pinned magnetic layer and the second pinned magnetic layer through annealing at a higher temperature than 360° C. or through annealing for a long time even at 360° C., and there has been a problem that the exchange coupling magnetic field cannot be generated (refer to Nonpatent Literature 2).

It is reported that the Ru layer has an effect to prevent a thermal diffusion of Mn from an anti-ferromagnetic layer, which is used as the anti-ferromagnetic layer, made of a Mn alloy (refer to Nonpatent Literature 4).

According to a report from Lee et al, it has been found that heat resistance can be increased by increasing the thickness of the Ru layer, and that the MR (magnetoresistance) ratio can be further increased through annealing at high temperature.

However, it is not practical because an increase of the Ru film thickness decreases the exchange coupling magnetic field based on the RKKY interaction. Especially, because a high temperature process beyond 350° C. is included in the manufacturing process of magnetic random access memory, the above-described problem is serious.

Nonpatent Literature 1: D. Djayaprawira et al, Applied Physics Letters, 86, 092502(2005)
Nonpatent Literature 2: Y. S. Choi et al, Applied Physics Letters, 101, 013907 (2007)
Nonpatent Literature 3: Hasegawa et al, Journal of the Magnetic Society of Japan, vol. 24, No. 9, 1239 (2000)
Nonpatent Literature 4: Y. M. Lee et al, Applied Physics Letters, 89, 042506 (2006)

SUMMARY OF THE INVENTION

Problems to be Solved by the Invention

The objective of the present invention is to provide a spin valve tunnel magnetoresistive thin film having a high MR ratio. More specifically, it is to provide a configuration that has improved heat resistance and that allows a Ru layer, which is used as a non-magnetic layer for exchanging coupling, to generate a good exchange coupling magnetic field even through annealing at a high temperature while the Ru layer is still a thin film.

Means for Solving the Problems

A first aspect of the present invention is a tunnel magnetoresistive thin film. The film includes an anti-ferromagnetic layer, a tunnel barrier layer, a first pinned magnetic layer, a second pinned magnetic layer, a non-magnetic layer for exchange coupling, and a free magnetic layer. The first pinned magnetic layer is located on a side of the anti-ferromagnetic layer and contains a magnetic material and boron atoms. The second pinned magnetic layer is located on a side of the tunnel barrier layer and contains a magnetic material and boron atoms. The non-magnetic layer for exchange coupling is located between the first pinned magnetic layer and the second pinned magnetic layer. The first pinned magnetic layer includes an anti-ferromagnetic layer side layer, which is located on a side of the anti-ferromagnetic layer, and a non-magnetic layer for exchange coupling side layer, which is located on a side of the non-magnetic layer for exchange coupling. A content ratio, in atomic %, of the boron atoms contained in the anti-ferromagnetic layer side layer is different from a content ratio, in atomic %, of the boron atoms contained in the non-magnetic layer for exchange coupling side layer.

The present aspect of the invention includes the following configurations as preferred aspects.

The tunnel barrier layer may be a magnesium oxide film containing (001)-oriented magnesium oxide crystal grains.

The content ratio of the boron atom contained in the anti-ferromagnetic layer side layer of the first pinned magnetic layer may be larger than the content ratio of the boron atom contained in the non-magnetic layer for exchange coupling side layer of the first pinned magnetic layer.

The anti-ferromagnetic layer side layer of the first pinned magnetic layer may be made of an alloy containing 50 atomic % or more of cobalt atom and 5 atomic % or more of boron atom and iron atom, and the non-magnetic layer for exchange coupling side layer of the first pinned magnetic layer may be made of an alloy containing 50 atomic % or more of cobalt atom and less than 5 atomic % of boron atom and iron atom.

The content ratio of the boron atom contained in the non-magnetic layer for exchange coupling side layer of the second pinned magnetic layer may be larger than the content ratio of the boron atom contained in the tunnel barrier layer side layer of the second pinned magnetic layer.

The second pinned magnetic layer may have a layered body structure having: the non-magnetic layer for exchange coupling side layer located on the side of the non-magnetic layer for exchange coupling; and the tunnel barrier layer side layer located on the side of the tunnel barrier layer, the non-magnetic layer for exchange coupling side layer may be made of an alloy containing 50 atomic % or more of cobalt atom and 15 atomic % or more of boron atom and iron atom, and the tunnel barrier layer side layer may be made of an amorphous alloy containing 40 atomic % or more of iron atom, 5 atomic % or more of boron atom, and 15 atomic % or less of cobalt atom.

The non-magnetic layer for exchange coupling may be made of a metal or an alloy containing at least one type selected from a group consisting of a Ru atom, a Rh atom, and an Ir atom, and may have film thickness of 1 nm or less.

Further, a second aspect of the present invention is a magnetic multilayer formation apparatus including: a transfer chamber provided with a robot transfer device; a first sputtering film deposition chamber arranged to connect with the transfer chamber through a gate valve and provided with a first magnetic target, a second magnetic target, a third magnetic target, an anti-ferromagnetic target, and a non-magnetic target, the first magnetic target containing cobalt atom, iron atom, and boron atom, the second magnetic target containing boron atom of a content ratio different from that of the boron atom in the first magnetic target, cobalt atom, and iron atom, the third magnetic target containing cobalt atom and iron atom and containing substantially no boron atom, the anti-ferromagnetic target containing an anti-ferromagnetic material, and the non-magnetic target for exchange coupling containing a non-magnetic material; a second sputtering film deposition chamber arranged to connect with the transfer chamber through a gate valve and provided with a magnesium oxide target and/or a magnesium target; a third sputtering film deposition chamber arranged to connect with the transfer chamber through a gate valve and configured to deposit a free magnetic layer by sputtering using a magnetic target; and a transfer mechanism configured to deposit: an anti-ferromagnetic layer on a substrate by sputtering using the anti-ferromagnetic target, a pinned magnetic layer of the first magnetic material on the anti-ferromagnetic layer by sputtering using the first magnetic target, a pinned magnetic layer of the second magnetic material on the pinned magnetic layer by sputtering using the second magnetic target, a non-magnetic layer for exchange coupling on the pinned magnetic layer by sputtering using the non-magnetic target, and a pinned magnetic layer of the third magnetic material on the non-magnetic layer for exchange coupling by sputtering using the third magnetic target, in the first sputtering film deposition chamber; a tunnel barrier layer consisting of a magnesium oxide layer or a layered body of a metal magnesium layer and a magnesium oxide layer on the pinned magnetic layer of the third magnetic material by sputtering using a magnesium oxide target and/or a magnesium target in the second sputtering film deposition chamber; and a free magnetic layer on the tunnel barrier layer in the third sputtering film deposition chamber.

In the present aspect of the invention, the content ratio of the boron atom contained in the first magnetic target may be larger than the content ratio of the boron atom contained in the second magnetic target as a preferred aspect.

A third aspect of the present invention is a magnetic multilayer formation apparatus including: a transfer chamber provided with a robot transfer device; a first sputtering film deposition chamber arranged to connect with the transfer chamber through a gate valve and provided with a first magnetic target, a second magnetic target, a third magnetic target, an anti-ferromagnetic target, and a non-magnetic target, the first magnetic target containing cobalt atom, iron atom, and boron atom, the second magnetic target containing boron atom of a content ratio different from that of the boron atom in the first magnetic target, cobalt atom, and iron atom, the anti-ferromagnetic target containing an anti-ferromagnetic material, and the non-magnetic target for exchange coupling containing a non-magnetic material; a second sputtering film deposition chamber arranged to connect with the transfer chamber through a gate valve and provided with a third magnetic target containing cobalt atom, iron atom, and boron atom, and a fourth magnetic target containing boron atom of a content ratio different from the boron atom in the third magnetic target, cobalt atom, and iron atom; a third sputtering film deposition chamber arranged to connect with the transfer chamber through a gate valve and provided with a magnesium oxide target and/or a magnesium target; a fourth sputtering film deposition chamber arranged to connect with the transfer chamber through a gate valve and configured to deposit a free magnetic layer by sputtering using a magnetic target; and a transfer mechanism configured to deposit: an anti-ferromagnetic layer on a substrate by sputtering using the anti-ferromagnetic target, a pinned magnetic layer of the first magnetic material on the anti-ferromagnetic layer by sputtering using the first magnetic target, a pinned magnetic layer of the second magnetic material on the pinned magnetic layer by sputtering using the second magnetic target, and a non-magnetic layer for exchange coupling on the pinned magnetic layer by sputtering using the non-magnetic target, in the first sputtering film deposition chamber; a pinned magnetic layer of the third magnetic material on the non-magnetic layer for exchange coupling by sputtering using the third magnetic target, and a pinned magnetic layer of the fourth magnetic material on the pinned magnetic layer by sputtering using the fourth magnetic target, in the second sputtering film deposition chamber; a film of the tunnel barrier layer consisting a magnesium oxide layer or of a layered body of a metal magnesium layer and a magnesium oxide layer on the pinned magnetic layer of the fourth magnetic material by sputtering using a magnesium oxide target and/or a magnesium target in the third sputtering film deposition chamber; and a free magnetic layer on the tunnel barrier layer in the fourth sputtering film deposition chamber.

In the third aspect of the invention, the content ratio of the boron atom contained in the first magnetic target may be larger than the content ratio of the boron atom contained in the second magnetic target as a preferred aspect.

Effect of the Invention

According to the present invention, a large MR ratio can be obtained under annealing in a high temperature range.

Further, according to the present invention, a high numeric value of the exchange coupling magnetic field ($H_{ex}$*) and a high numeric value of the saturated magnetic field ($H_s$*) can be obtained under annealing in a high temperature range.

The present invention can be advantageously applied to a manufacturing process of a magnetic random access memory (MRAM), particularly including a high temperature process beyond 350° C. as an essential process.

DESCRIPTION OF THE REFERENCE NUMERALS 1 substrate
2 buffer layer
3, 13 anti-ferromagnetic layer
4, 14 first pinned magnetic layer
4a, 14a anti-ferromagnetic layer side layer
4b, 14b non-magnetic layer for exchange coupling side layer
5 non-magnetic layer for exchange coupling
6, 16 second pinned magnetic layer
6c, 16c non-magnetic layer for exchange coupling side layer
6d, 16d tunnel barrier layer side layer
7, 17 tunnel barrier layer
8 free magnetic layer
9 protective layer
20 vacuum transfer chamber
21, 22, 23, 24 sputtering chamber
21a $Co_{70}Fe_{20}B_{10}$ target
21b Ta target
21c PtMn target
21d $Co_{60}Fe_{20}B_{20}$ target
21e Ru target
22a $Co_{70}Fe_{30}$ target
22b PtMn target
22c $Co_{64}Fe_{16}B_{20}$ target
22d Ru target
22e $Co_{22}Fe_{66}B_{12}$ target
23a MgO target
23b Mg target
24a Ta target
24b $Co_{60}Fe_{20}B_{20}$ target
24c Ru target
25 substrate pre-processing chamber
26 oxidation processing chamber
27 loadlock chamber
28 robot for substrate transfer
42 word line for rewriting
43 bit line
44 word line for reading
45 tmr element
46 transistor

DESCRIPTION OF THE PREFERRED EMBODIMENTS

Embodiments of the present invention are described referring to the views.

Figure 1:
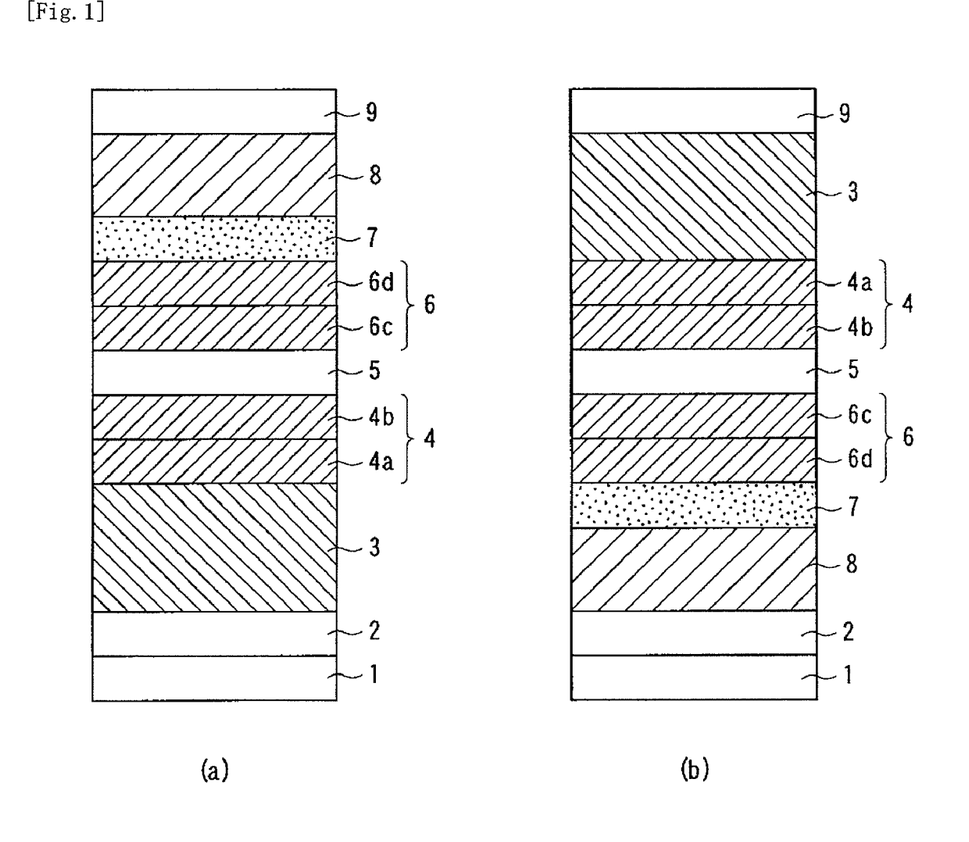
FIG. 1 A cross-sectional schematic views of an embodiment of the tunnel magnetoresistive thin film of the present invention.
Figure 2:
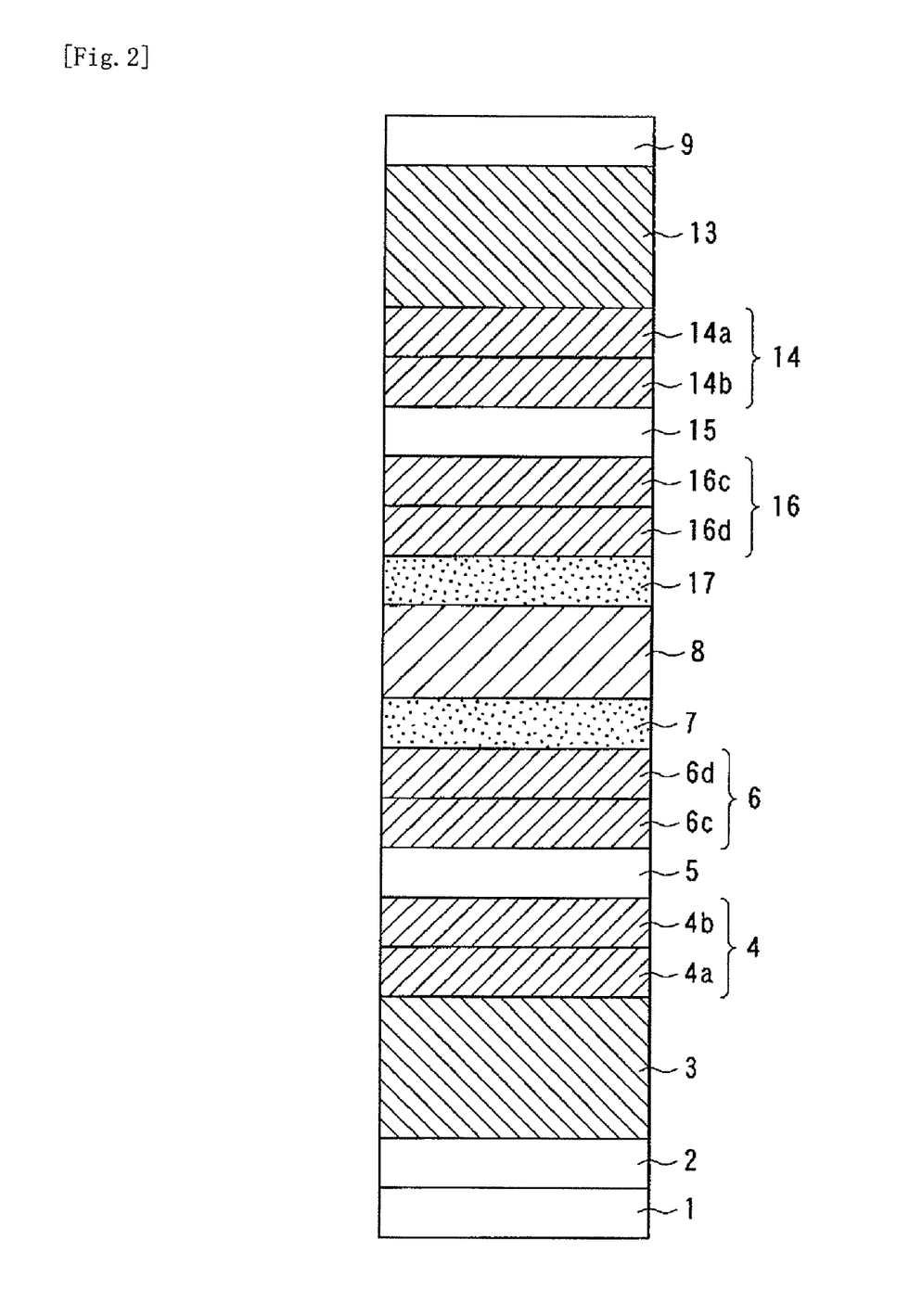
FIG. 2 A cross-sectional schematic view of an embodiment of the tunnel magnetoresistive thin film of the present invention.

FIGS. 1 and 2 are cross-sectional schematic views of embodiments of the tunnel magnetoressistive thin film of the present invention.

The tunnel magnetoresistive thin film of the present invention is a layered body consisting of at least an anti-ferromagnetic layer, a first pinned magnetic layer, a non-magnetic layer for exchange coupling, a second pinned magnetic layer, a tunnel barrier layer, and a free magnetic layer. In the layered body, the anti-ferromagnetic layer, the first pinned magnetic layer, the non-magnetic layer for exchange coupling, the second pinned magnetic layer, the tunnel barrier layer, and the free magnetic layer are layered in this order.

FIG. 1(a) is a bottom type in which an anti-ferromagnetic layer 3 is arranged on a substrate 1 side, and FIG. 1(b) is a top type in which a free magnetic layer 8 is arranged on the substrate 1 side. Furthermore a dual type, in which a tunnel barrier layer, a second pinned magnetic layer, a non-magnetic layer for exchange coupling, a first magnetic layer, and an anti-ferromagnetic layer are layered in this order on the free magnetic layer 8 on its both sides sandwiching the free magnetic layer 8 as shown in FIG. 2, can be preferably applied in the present invention.

A characteristic of the configuration of the present invention is that at least either of first pinned magnetic layers 4, 14 or second pinned magnetic layers 6, 16 respectively consist of two or more layers of magnetic materials different from each other. The Embodiments of FIGS. 1 and 2 are cases that both of the first pinned magnetic layers 4, 14 and the second pinned magnetic layers 6, 16 are respectively of two-layered configuration. For convenience, in the first pinned magnetic layers 4, 14, layers 4a, 14a contacting anti-ferromagnetic layers 3, 13 are referred to as a layers; and layers 4b, 14b contacting non-magnetic layers for exchange coupling 5, 15 are referred to as b layers, respectively. Further, in the second pinned magnetic layers 6, 16, layers 6c, 16c contacting non-magnetic layers for exchange coupling 5, 15 are referred to as c layers; and layers 6d, 16d contacting tunnel barrier layers 7, 17 are referred to as d layers, respectively.

In the present invention, "magnetic materials different from each other" may be magnetic materials having constituent elements different from each other; magnetic materials having combinations of the constituent elements different from each other; or magnetic materials having the same combinations of the constituent elements as each other and the composition ratios different from each other.

In the present invention, a preferred combination of magnetic materials for the anti-ferromagnetic layer side layers 4a, 14a of the first pinned magnetic layer 4, 14 is a CoFeB alloy (CoFeB) containing 50 atomic % or more of Co and 5 atomic % or more of B. While a preferred combination of magnetic materials for the non-magnetic layer for exchange coupling side layers 4b, 14b is a CoFe alloy (CoFe) containing 50 atomic % or more of Co or CoFeB containing 50 atomic % or more of Co and less than 5 atomic % of B. A small amount of other components such as Ni (nickel) and C (carbon) for example can be contained in the anti-ferromagnetic layer side layers 4a, 14a and the non-magnetic layer for exchange coupling side layers 4b, 14b.

Further, the non-magnetic layer for exchange coupling side layers 6a, 16a of the second pinned magnetic layers 6, 16 are preferably CoFeB containing 50 atomic % or more of Co and 15 atomic % or more of B, while the tunnel barrier layer side layers 6d, 16d are preferably amorphous CoFeB containing 40 atomic % or more of Fe and 5 atomic % to 15 atomic % of B. A small amount of other components such as Ni (nickel), N (nitrogen), and C (carbon) for example can be contained in the non-magnetic layer for exchange coupling side layers 6a, 16a and the tunnel barrier layer side layers 6d, 16d.

Moreover, in the present invention, a CoFeB alloy and a CoFe alloy used for the free magnetic layer 8 can be preferably made to have 100 atomic % of the alloy constituent elements. However, a small amount of other elements (for example, Ni, N, C, etc.) can be contained.

The film thickness of the first pinned magnetic layers 4, 14 is preferably a film thickness allowing the exchange coupling magnetic field ($H_{ex}$) acting between the anti-ferromagnetic layers 3, 13 and the first pinned magnetic layers 4, 14 to be 1 kOe or more. Specifically, a thickness of 2.5 nm or less is typically used although it differs depending on the material used in the anti-ferromagnetic layers 3, 13 and the first pinned magnetic layers 4, 14. Further, in the first pinned magnetic layers 4, 14, the thickness ratio of the a layers 4a, 14a and the b layers 4b, 14b is not necessarily made to be equal, i.e. 1:1, and the same effect can be expected with unequal thickness ratio as long as the thickness of the thinner ones is 0.5 nm or more.

The total film thickness of the second pinned magnetic layers 6, 16 is preferably a film thickness allowing the exchange coupling magnetic field ($H_{ex}$) between the first pinned magnetic layers 4, 14 and the second pinned magnetic layers 6, 16 having the non-magnetic layers for exchange coupling 5, 15 therebetween to be 1 kOe or more. Specifically, it is typically 3 nm or less although it differs depending on the materials used for the first pinned layers 4, 14, the non-magnetic layers for exchange coupling 5, 15, and the second pinned magnetic layers 6, 16. Further, in the second pinned magnetic layers 6, 16, the thickness ratio of the c layers 6c, 16c and the d layers 6d, 16d is not necessarily made to be equal, i.e. 1:1, and the same effect can be expected with unequal thickness ratio as long as the thickness of the thinner ones is 0.5 nm or more.

In the tunnel magnetoresistive thin film of the present invention, a MgO film containing (001)-oriented MgO crystal grains is preferably used as the tunnel barrier layers 7, 17. The orientation of such MgO film can be confirmed with X-ray diffraction. That is, when a (200) diffraction peak appears at around $2\theta=43°$ with the X-ray diffraction (a $\theta$-$2\theta$ method), the (001)-orientation can be found indirectly. Further, as a more direct confirmation method, the (001)-orientation can be confirmed by observing a cross-sectional image with a transmission electron microscope. At that time, the (001)-orientation can be confirmed more clearly by irradiating an electron beam onto the MgO layer and analyzing its diffraction pattern.

A two-layered film of Mg/MgO can be used also as the tunnel barrier layers 7, 17. Such Mg/IMgO film is reported by Tunekawa et al in Appl. Phys. Lett., 87, 072503 (2005). The film thickness of the MgO film and the two-layered film of Mg/MgO changes depending on the tunnel junction resistance (RA) of the tunnel magnetoresistive thin film. However, it is typically between 1 and 2 nm because the RA value that is necessary for a magnetic head and a magnetic random access memory is 1 to 10000 $\Omega\mu m^2$.

Further, it is preferable that the non-magnetic layers for exchange coupling 5, 15 respectively is made of an alloy consisting of one type or two types or more selected from Ru, Rh, and Ir, and that the film thickness thereof is 1 nm or less. The film thickness of a Ru layer is necessarily made to be a film thickness causing anti-ferromagnetic coupling between the first pinned layers 4, 14 and the second pinned magnetic layers 6, 16 due to the RKKY interaction, and practically, 0.7 to 0.9 nm, at which a $2^{nd}$ peak is said to occur, is preferable.

Furthermore, PtMn is preferably used for the anti-ferromagnetic layers 3, 13 according to the present invention, and the film thickness is preferably 10 to 30 nm because the film thickness causing strong anti-ferromagnetic coupling is necessary. IrMn, IrMnCr, NiMn, PdPtMn, RuRhMn, OsMn, or the like can be preferably used other than PtMn.

Next, a manufacturing method of the tunnel magnetoresistive thin film of the present invention is described. The tunnel magnetoresistive thin film of the present invention may be formed by layering desired films in a specific order on the substrate 1.

FIG. 1 is a planar view schematically showing a configuration of a sputtering apparatus for manufacturing the tunnel magnetoresistive thin film of the present invention. Such apparatus includes: a vacuum transfer chamber (transfer chamber) 20, in which two robots 28 for transferring substrate, sputtering chambers (film deposition chambers) 21 to 24 connected to the vacuum transfer chamber 20, a substrate pre-processing chamber 25, an oxidation processing chamber 26, and a loadlock chamber 27. All chambers except the loadlock chamber 27 are a vacuum chamber of 2×10-6 Pa or less pressure, and the substrate is transferred between the vacuum chambers in vacuum by the vacuum transfer robot 28.

Figure 3:
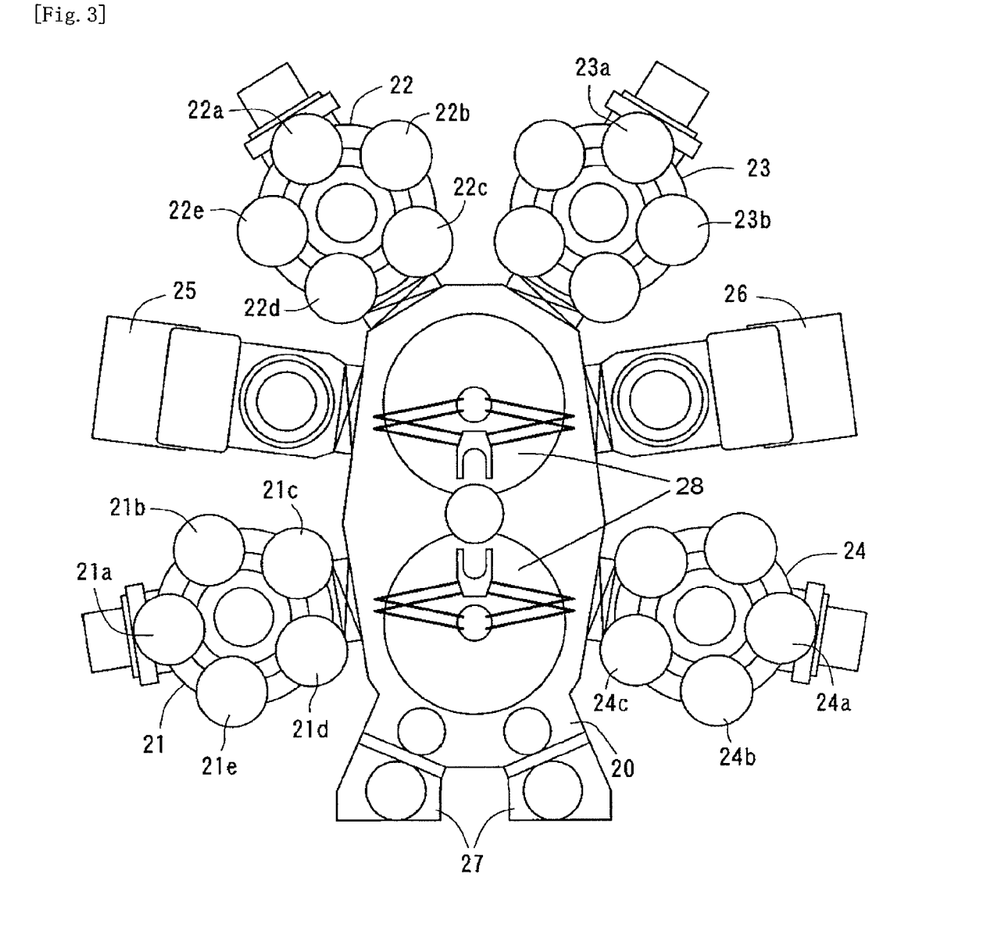
FIG. 3 A plan view schematically showing a configuration of the sputtering apparatus for manufacturing the tunnel magnetoresistive thin film of the present invention.

A substrate for forming the spin valve tunnel magnetoresistive thin film is first disposed in the loadlock chamber 27 of atmospheric pressure. After the loadlock chamber 27 is vacuumed, the substrate is transferred to a desired vacuum chamber by the vacuum transfer robot 28.

The manufacturing method is described for a case of manufacturing the bottom type tunnel magnetoresistive thin film, which was manufactured in an Example described later, for example. The configuration of each layer is that the buffer layer 2 is of Ta (10 nm), the anti-ferromagnetic layer 3 is of PtMn (15 nm), the non-magnetic layer for exchange coupling 5 is of Ru (0.85 nm), the tunnel barrier layer 7 is of MgO (1 nm), and the free magnetic layer 8 is of $Co_{60}Fe_{20}B_{20}$ (3 nm). Here, the film thickness is shown in ( ), and subscript number in $Co_{60}Fe_{20}B_{20}$ shows the atomic % (below, the same).

The composition of the sputtering targets and the film forming conditions (types of gasses, gas pressure, and applied power) of the PtMn layer are adjusted in a manner that the Pt content becomes 47 to 51 (atomic %) so that the PtMn layer is regulated to be anti-ferromagnetic by annealing. In the case of using IrMn for the anti-ferromagnetic layer 3, the composition of the sputtering targets and the film forming conditions (types of gasses, gas pressure, and applied power) are adjusted in a manner that the Ir content becomes 18 to 30 (atomic %). The film thickness is preferably 4 to 15 nm in order to obtain as high $H_{ex}$ as possible. Further, it is more effective to use a Ru layer as a seed layer for promoting the (111)-orientation of IrMn having a fcc structure between Ta that is the buffer layer 2 and the IrMn layer, and its film thickness is preferably 1 to 50 nm.

In order to effectively form the film configuration as described above, each of the sputtering targets is disposed in each of the sputtering chambers. A $Co_{70}Fe_{20}B_{10}$ sputtering target 21a, a Ta sputtering target 21b, a PtMn sputtering target 21c, a $Co_{60}Fe_{20}B_{20}$ sputtering target 21d, and a Ru sputtering target 21e are disposed in a sputtering chamber 21. A $Co_{70}Fe_{30}$ sputtering target 22a, a PtMn sputtering target 22b, a $Co_{64}Fe_{16}B_{20}$ sputtering target 22c, a Ru sputtering target 22d, and a $Co_{22}Fe_{66}B_{12}$ sputtering target 22e are disposed in a sputtering chamber 22. A MgO sputtering target 23a and a Mg sputtering target 23b are disposed in a sputtering chamber 23. A Ta sputtering target 24a, a $Co_{60}Fe_{20}B_{20}$ sputtering target 24b, and a Ru sputtering target 24c are disposed in a sputtering chamber 24. Here, a layered film of the anti-ferromagnetic layer 3, the first pinned magnetic layer 4 or 14, the non-magnetic layer for exchange coupling 5, and the second pinned magnetic layer 6 or 16 can be deposited in the same sputtering chamber using the sputtering chamber 21 or 22.

Further, a layered body consisting of the anti-ferromagnetic layer 3, the first pinned layer 4 or 14, the non-magnetic layer for exchange coupling 5, and the second pinned magnetic layer 6 or 16 shown in FIGS. 1 and 2 can be formed by sputtering using both of the sputtering chambers 21 and 22.

(Example of Film Deposition)

The substrate 1 is transferred to the substrate pre-processing chamber 25, and about 2 nm of the surface layer that is contaminated in atmosphere is physically removed by reverse sputter etching. After that, it is transferred to the sputtering chamber 21, and a layered film of Ta (the buffer layer 2)/PtMn (the anti-ferromagnetic layer 3)/the first pinned magnetic layer 4/Ru (the non-magnetic layer for exchange coupling 5)/the second pinned magnetic layer 6 is deposited in the sputtering chamber 21 (a first process).

Further, the substrate 1 is transferred to the substrate pre-processing chamber 25, about 2 nm of the surface layer that is contaminated in atmosphere is physically removed by reverse sputter etching, then it is transferred to the sputtering chamber 21, and a Ta film (the buffer layer 2) is deposited in the sputtering chamber 21. Next, the substrate 1 with Ta (the buffer layer 2) is moved to the sputtering chamber 22, and a layered film of PtMn (the anti-ferromagnetic layer 3)/the first pinned magnetic layer 4/Ru (the non-magnetic layer for exchange coupling 5)/the second pinned magnetic layer 6 is formed in the sputtering chamber 22 (a second process).

In either cases of the above-described first process and second process, after forming the second pinned magnetic layer 6, the substrate is moved to the sputtering chamber 23, and then a MgO (magnesium oxide) film or a two-layered film of Mg (magnesium)/MgO (magnesium oxide) is formed as the tunnel barrier layer 7.

As an alternative depositing method of the MgO tunnel barrier layer, a MgO film having a NaCl structure may be formed by forming a metal Mg film in the sputtering chamber 23; transferring the substrate to the oxidation processing chamber 26; and performing an oxidation process on the Mg layer with a radical oxidation method, a natural oxidation method, or the like. After forming the tunnel barrier layer 7, the substrate is transferred to the sputtering chamber 24, a layered film of CoFeB (the free magnetic layer 8)/Ta (the protective layer 9)/Ru (the protective layer 9) is formed, and then the substrate is returned to the loadlock chamber 27.

After the processes, the manufactured tunnel magnetoresistive thin film is placed in an annealing furnace in a magnetic field, and an annealing process is performed at a desired temperature and time in vacuum while applying a magnetic field parallel to one direction of strength 8 kOe or more. The appropriate temperature and time are qualitatively those causing energy, which is no less than the crystallization energy of the amorphous CoFeB layer and no more than the energy with which the very thin Ru layer used as the non-magnetic layer for exchange coupling deteriorates due to thermal diffusion, to be applied. The temperature is typically 250 to 360° C., and a long time such as 5 hours or more is preferable in the case of low temperature, and a short time such as 3 hours or less is preferable in the case of high temperature in view of the above-described energy.

The tunnel magnetoresistive thin film of the present invention can be preferably used in a magnetic reproducing head of a magnetic disk drive device, and a storage element and a magnetic sensor of a magnetic random access memory (MRAM). The MRAM using the tunnel magnetoresistive thin film of the present invention is described below as an example.

Figure 4:
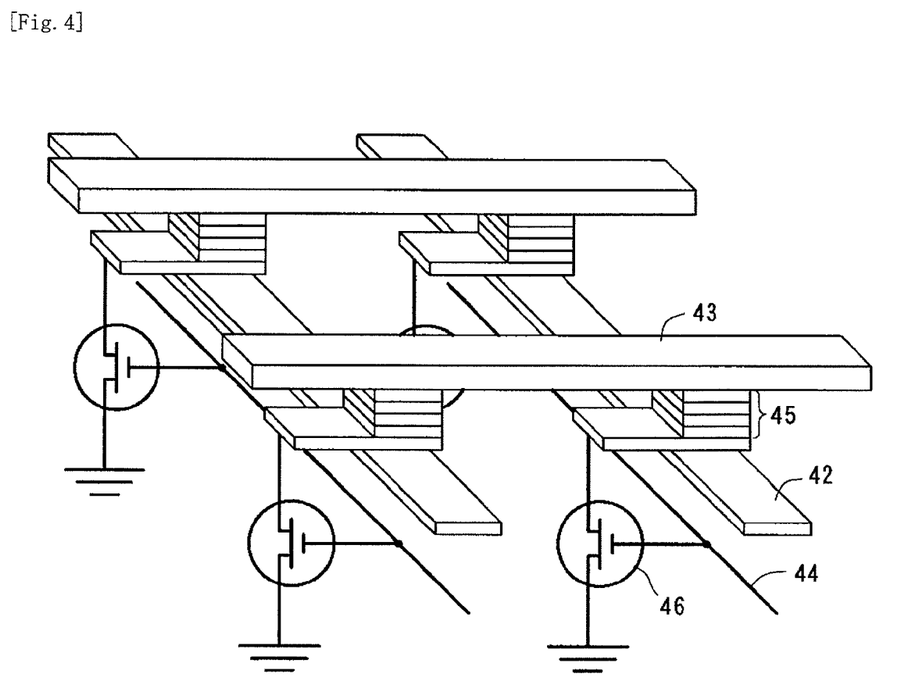
FIG. 4 A view showing a configuration of MRAM.
Figure 5:
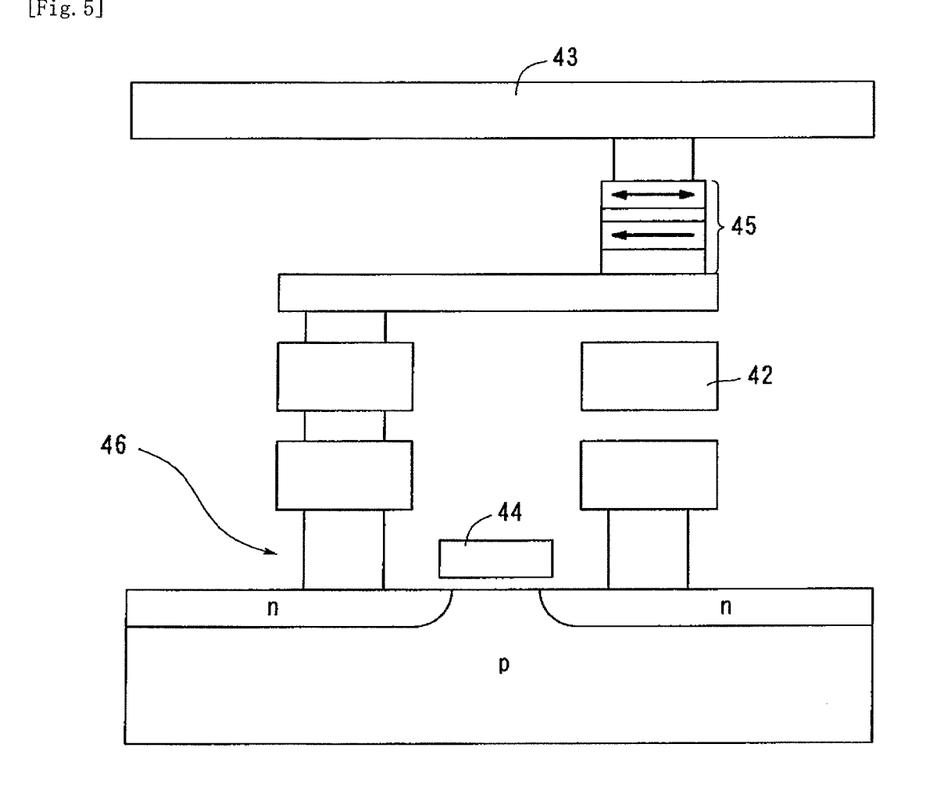
FIG. 5 A cross-sectional schematic view of one memory cell of the MRAM in FIG. 4.
Figure 6:
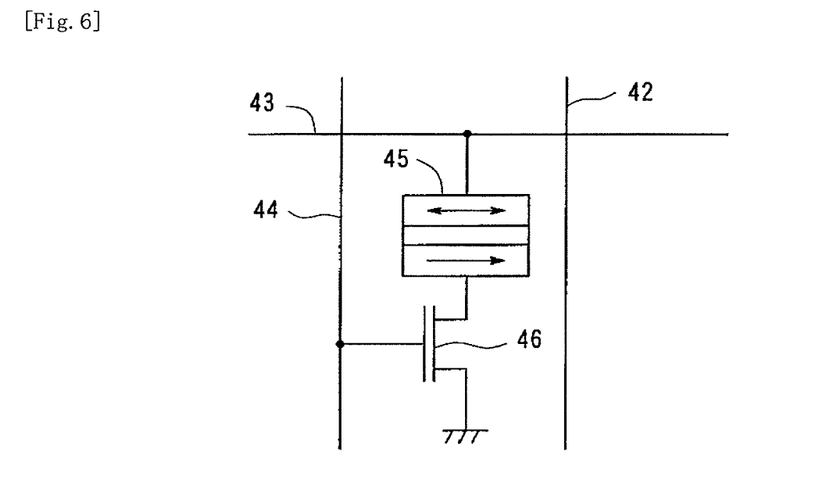
FIG. 6 An equivalent circuit diagram of one memory cell of the MRAM in FIG. 4.

FIG. 4 is a view schematically showing a structure of the MRAM; FIG. 5 is a cross-sectional schematic view of one memory cell of the MRAM; and FIG. 6 is an equivalent circuit diagram of the one memory cell of the MRAM. The MRAM includes a word line for rewriting 42, a bit line 43, a word line for reading 44, and a magnetoresistive element 45. Each of the plurality of the memory cells is arranged at each of intersecting positions where a plurality of bit lines 43 and the word lines for reading 44 intersect so as to be in a lattice position relationship, and each of the memory cells stores one bit information.

As shown in FIGS. 5 and 6, the memory cell of the MRAM includes: a magnetoresistive (TMR) element 45 that stores one bit information at an intersecting point of a bit line 43 and a word line for reading 44; and a transistor 46 having a switch function. The tunnel magnetoresistive thin film of the present invention is used as the above-described TMR element 45.

An external magnetic field is applied to the TMR element 45 while a prescribed voltage is applied between the ferromagnetic layers on both sides of the tunnel barrier layer 7 (the second pinned magnetic layer 6 and the free magnetic layer 8) shown in FIG. 1(a). to flow a certain current. When the directions of magnetization of the second pinned magnetic layer 6 and the free magnetic layer 8 are parallel and the same (a parallel state), the electric resistance of the TMR element 45 becomes minimum, and when the directions of magnetization of the second pinned magnetic layer 6 and the free magnetic layer 8 is parallel and opposite (an anti-parallel state), the electric resistance of the TMR element 45 becomes maximum. In such way, the information of "1" or "0" can be stored as a change of the resistance by creating the parallel state or the anti-parallel state in the TMR element 45 by the external magnetic field.

In the MRAM in FIG. 4, the word line for rewriting 42 is arranged below the TMR element 45 in parallel to the word line for reading 44, that is, the world line for rewriting 42 intersects with the bit line 43 as shown in the FIG. 5. Therefore, the magnetic fields are induced by flowing a current through the bit line 43 and the word line for rewriting 42, and then only the free magnetic layer of the TMR element of the memory cell at the intersection of the bit line 43 and the word line for rewriting 42 is affected by the magnetic fields from the both lines, resulting in magnetization reversal. The TMR elements 45 of other memory cells are not affected by the magnetic fields of either of the lines at all or affected by the magnetic field of either one of the bit line 43 and the word line for rewriting 42, and thus the magnetization reversal does not occur in the free magnetic. In such way, writing is performed by reversing magnetization of the free magnetic layer of the TMR element 45 only of the desired memory cell. When reading, a gate of the transistor 46 located below the TMR element 45 works as the word line for reading 44. Since a current flows in the TMR element 45 only of the memory cell located at the intersection of the bit line 43 and the word line for reading 44, the resistance of such TMR element 45 can be measured by detecting the voltage at that time so as to obtain the information of "1" or "0".

EXAMPLES

Example 1

A bottom type spin valve tunnel magnetoresistive thin film was manufactured using the apparatus shown in FIG. 3. In the example, the buffer layer 2 was of Ta (10 nm), the anti-ferromagnetic layer 3 was of PtMn (15 nm), the non-magnetic layer for exchange coupling 5 was of Ru (0.85 nm), the tunnel barrier layer 7 was of MgO (1 nm), and the free magnetic layer 8 was of $Co_{60}Fe_{20}B_{20}$ (3 nm). The protective layer 9 was of Ta (10 nm)/Ru (7 nm). In the first pinned magnetic layer 4, $Co_{60}Fe_{20}B_{20}$ (1.25 nm) was used for the anti-ferromagnetic layer side layer 4a and $Co_{70}Fe_{20}B_{10}$ (1.25 nm) was used for the non-magnetic layer for exchange coupling side layer 4b, and a single layer of $Co_{60}Fe_{20}B_{20}$ (3 nm) was used as the second pinned magnetic layer 6.

As a comparative example, a tunnel magnetoresistive thin film having the same configuration as described above, except that $CO_{70}Fe_{20}B_{10}$ (2.5 nm) was used as the anti-ferromagnetic layer side layer 4a of the first pinned magnetic layer 4 and $Co_{60}Fe_{20}B_{20}$ (1.25 nm) was used as the non-magnetic layer for exchange coupling side layer 4b, was manufactured.

In the case of the present example, processes from a process of depositing a the buffer layer 2 of Ta and up to a process before depositing the tunnel barrier layer 8 (processes up to depositing the second pinned magnetic layer 6) were performed sequentially in the sputtering chamber 21 shown in the FIG. 3.

Figure 7:
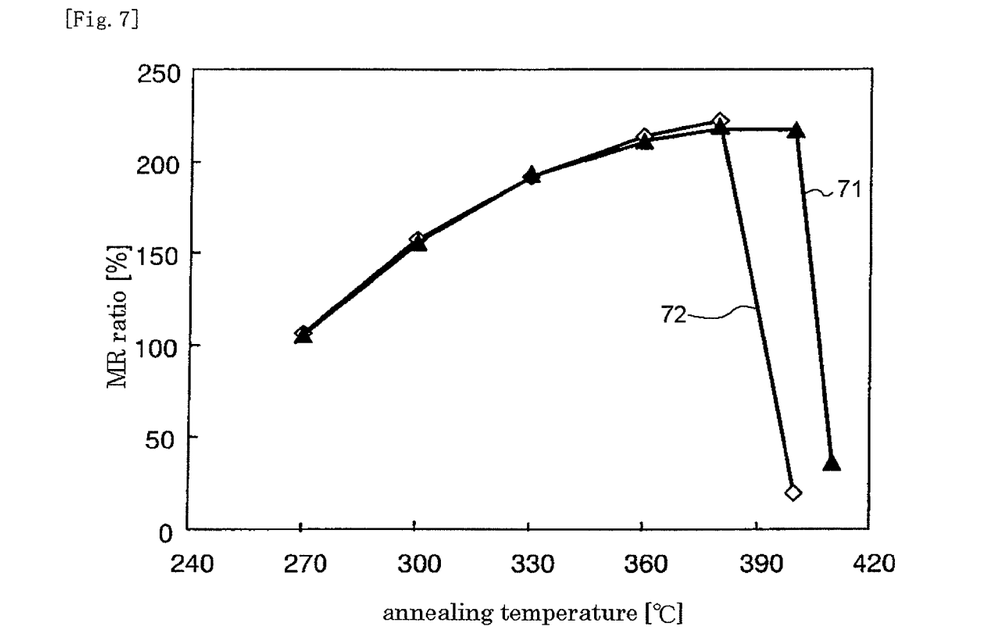
FIG. 7 A view showing the annealing temperature dependency of the MR ratio of the tunnel magnetoresistive thin film of Embodiment 1 in the present invention.
Figure 8:
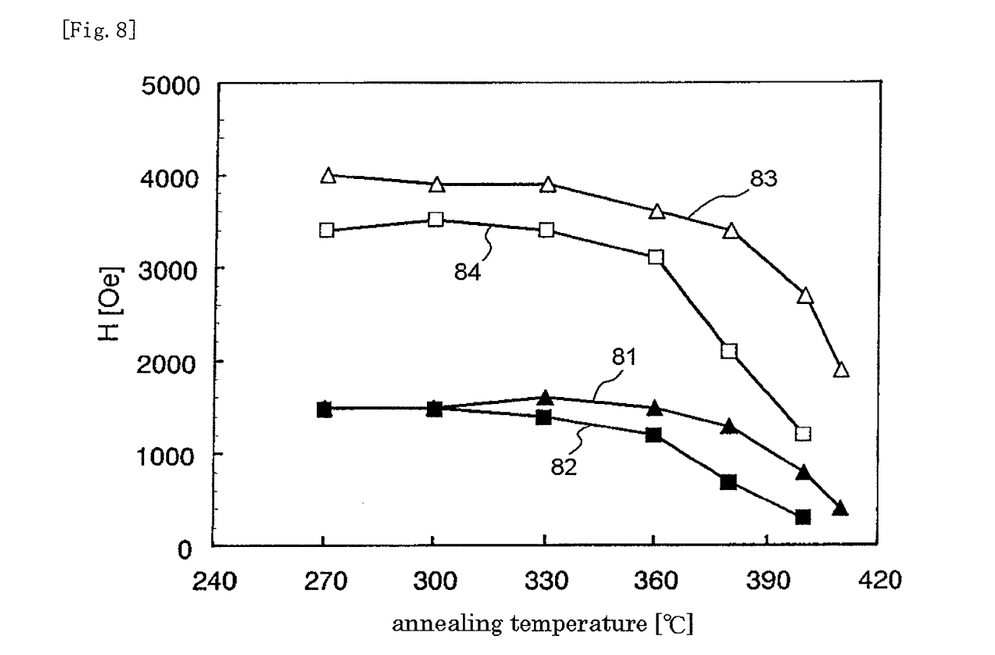
FIG. 8 A view showing the annealing temperature dependencies of: the exchange coupling magnetic field between the first pinned magnetic layer and the second pinned magnetic layer; and the saturated magnetic field of the exchange coupling magnetic field, of the tunnel magnetoresitive thin film of Embodiment 1 of the present invention.

FIGS. 7 and 8 show the MR ratio and the exchange coupling magnetic field respectively while changing the annealing temperature in a range of 270 to 400° C. with the constant annealing time of 2 hours.

In FIG. 7, a characteristic curve 71 shows the characteristic of the present example of the invention, and a characteristic curve 72 shows the characteristic of the above-described comparative example.

It can be seen from the characteristic comparison in FIG. 7 that the MR ratio rapidly decreases when an annealing temperature changes beyond 380° C. in the comparative example. On the other hand, a stable and high MR ratio was maintained until an annealing temperature changes up to about 400° C. in the present example of the invention.

Figure 9:
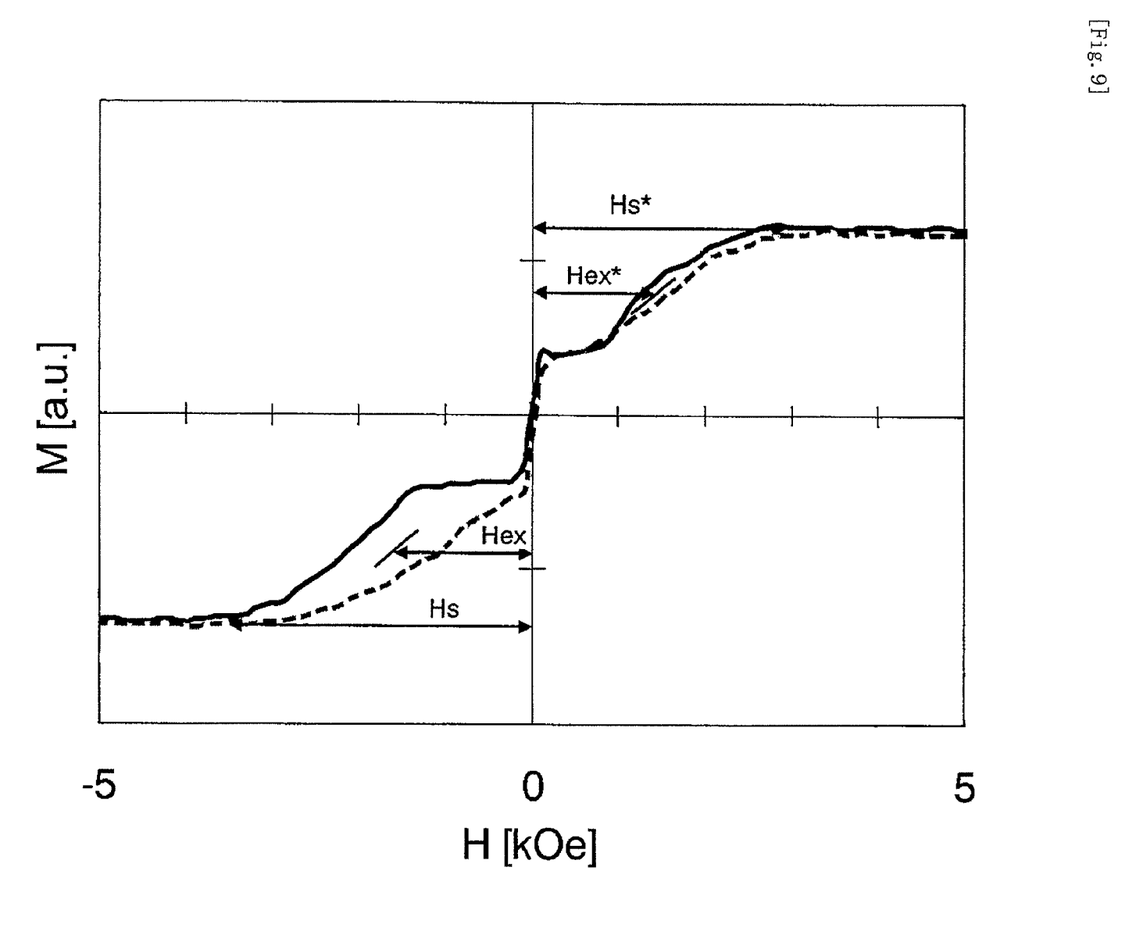
FIG. 9 A view showing the definitions of the exchange coupling magnetic field between the first pinned magnetic layer and the second pinned magnetic layer having the non-magnetic layer for exchange coupling therebetween and the saturated magnetic field of the exchange coupling magnetic field.

The FIG. 8 shows the annealing temperature dependencies of: the exchange coupling magnetic field ($H_{ex}*$) between the first pinned magnetic layer 4 and the second pinned magnetic layer 6 having the non-magnetic layer for exchange coupling 5 therebetween; and the saturated magnetic field ($H_s*$) of the exchange coupling magnetic field, in a magnetization curve of the spin valve tunnel magnetoresistive thin film. The definitions of $H_{ex}*$ and $H_s*$ are shown in FIG. 9.

In FIG. 8, a characteristic curve 81 shows the exchange coupling magnetic field ($H_{ex}*$) of the present example of the invention, and a characteristic curve 82 shows the exchange coupling magnetic field ($H_{ex}*$) of the comparative example.

In FIG. 8, a characteristic curve 83 shows the saturated magnetic field ($H_s*$) of the present example of the invention, and a characteristic curve 84 shows the saturated magnetic field ($H_s*$) of the comparative example.

According to FIG. 8, the exchange coupling magnetic field ($H_{ex}*$) of the present example of the invention shows high values in the high temperature region compared with the comparative example. An effect can be obtained in which the saturated magnetic field ($H_s*$) of the present example of the invention shows high values even in the low temperature region compared with the comparative example.

Here, in the present example, the MR ratio, $H_{ex}*$, and $H_s*$ were measured as follows.

MR ratio: A Current-In-Plane Tunneling (CIPT) method using 12-point probe was used. The measurement principle of the CIPT method is described in D. C. Worledge, P. L. Trouilloud, Applied Physics Letters, 83 (2003), 84-86.

$H_{ex}*$, $H_s*$: They were obtained from the magnetization curve obtained by using a vibration sampling magnetometer (VSM). The measurement principle of the VSM is shown in "Experimental Physics Lecture 6 Magnetic Measurement I" edited by Keiichiro Kon and Hiroshi Yasuoka published by Maruzen Tokyo on Feb. 15, 2000, for example.

Example 2

The same layer configuration used in Example 1 in the present invention was used except using a second pinned magnetic layer 6, which has a $CO_{64}Fe_{16}B_{20}$ layer (thickness: 1.5 nm) as a layer 6c on the side of the non-magnetic layer for exchange coupling and a $Co_{22}Fe_{66}B_{12}$ layer (thickness: 1.5 nm) as a layer 6d on the side of the tunnel barrier layer, instead of the second pinned magnetic layer 6 (a single layer of $Co_{60}Fe_{20}B_{20}$ (3 nm)) used in Example 1 in the present invention.

In the present example, a Ta layer (buffer layer 2) was deposited on a substrate 1 in the sputtering chamber 21 in FIG. 3, the substrate 1 with the Ta layer was transferred to the sputtering chamber 22, and layers from a first pinned magnetic layer 2 to a second pinned magnetic layer 6 were sequentially formed in the sputtering chamber 22.

The MR ratio and the exchange coupling magnetic field were examined for the tunnel magnetoresistive thin films of the present example obtained while changing the annealing temperature with the constant annealing time of 2 hours, similarly to Example 1. The result shows that an MR ratio, an exchange coupling magnetic field, and a saturated magnetic field were high even at high annealing temperature compared with Comparative Example, similarly to Example 1.

Example 3

In the tunnel magnetoresistive thin film shown in FIG. 2, for the first pinned magnetic layer 4 and the second pinned magnetic layer 6, the same layer as the second pinned magnetic layer 6 used in the above-described example 2 was used, and for other layers, the same layers as those layers used in the Example 1 were used.

In the present example, the Ta layer (the buffer layer 2) was deposited on the substrate 1 in the sputtering chamber 21 in FIG. 3; a processes from a process of depositing the first pinned magnetic layer 4 to a process of depositing the second pinned magnetic layer 6 were performed in the same sputtering chamber 21 in FIG. 3; the tunnel barrier layer 8 was deposited in the sputtering chamber 23; and a processes from a process of depositing the second pinned magnetic layer 16 to the process of depositing the first pinned magnetic layer 14 were performed in the sputtering chamber 22.

The same result as the above-described example 1 was obtained in the present example.

The invention claimed is:

1. A tunnel magnetoresistive thin film comprising:
   an anti-ferromagnetic layer;
   a tunnel barrier layer;
   a first pinned magnetic layer located on the side of the anti-ferromagnetic layer and containing a magnetic material and boron atom;
   a second pinned magnetic layer located on the side of the tunnel barrier layer and containing a magnetic material and boron atom;
   a non-magnetic layer for exchange coupling located between the first pinned magnetic layer and the second pinned magnetic layer; and
   a free magnetic layer, wherein:
   the first pinned magnetic layer has an anti-ferromagnetic layer side layer, which is located on the side of the anti-ferromagnetic layer, and a non-magnetic layer for exchange coupling side layer, which is located on the side of the non-magnetic layer for exchange coupling; and the content ratio of the boron atom contained in the anti-ferromagnetic layer side layer of the first pinned magnetic layer is larger than the content ratio of the boron atom contained in the non-magnetic layer for exchange coupling side layer of the first pinned magnetic layer.

2. The tunnel magnetoresistive thin film according to claim 1, wherein the tunnel barrier layer is a magnesium oxide film containing (001)-oriented magnesium oxide crystal grains.

3. The tunnel magnetoresistive thin film according to claim 1, wherein the content ratio of the boron atom contained in the non-magnetic layer for exchange coupling side layer of the second pinned magnetic layer is larger than the content ratio of the boron atom contained in the tunnel barrier layer side layer of the second pinned magnetic layer.

4. The tunnel magnetoresistive thin film according to claim 1, wherein the non-magnetic layer for exchange coupling is made of a metal or an alloy containing at least one type selected from a group consisting of a Ru atom, a Rh atom, and an Ir atom, and has a film thickness of 1 nm or less.

* * * * *